(12) United States Patent
Huang et al.

(10) Patent No.: US 9,214,629 B2
(45) Date of Patent: Dec. 15, 2015

(54) RESISTIVE MEMORY AND METHOD FOR FABRICATING THE SAME

(71) Applicant: Peking University, Beijing (CN)

(72) Inventors: Ru Huang, Beijing (CN); Yinglong Huang, Beijing (CN); Yimao Cai, Beijing (CN); Yangyuan Wang, Beijing (CN); Muxi Yu, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/360,596

(22) PCT Filed: Apr. 26, 2013

(86) PCT No.: PCT/CN2013/074760
§ 371 (c)(1),
(2) Date: May 23, 2014

(87) PCT Pub. No.: WO2014/036837
PCT Pub. Date: Mar. 13, 2014

(65) Prior Publication Data
US 2014/0306173 A1 Oct. 16, 2014

(30) Foreign Application Priority Data

Sep. 10, 2012 (CN) .......................... 2012 1 0333457

(51) Int. Cl.
| | |
|---|---|
| *H01L 21/00* | (2006.01) |
| *H01L 21/16* | (2006.01) |
| *H01L 21/20* | (2006.01) |
| *H01L 45/00* | (2006.01) |
| *H01L 27/24* | (2006.01) |

(52) U.S. Cl.
CPC .......... *H01L 45/145* (2013.01); *H01L 27/2409* (2013.01); *H01L 27/2436* (2013.01); *H01L 45/06* (2013.01); *H01L 45/1233* (2013.01); *H01L 45/1253* (2013.01); *H01L 45/146* (2013.01); *H01L 45/147* (2013.01); *H01L 45/1608* (2013.01); *H01L 45/1641* (2013.01)

(58) Field of Classification Search
None
See application file for complete search history.

(56) References Cited

U.S. PATENT DOCUMENTS

| | | | | |
|---|---|---|---|---|
| 8,502,343 | B1 * | 8/2013 | Jha ........................ | H01L 45/08 257/536 |
| 2005/0247921 | A1 * | 11/2005 | Lee et al. .......................... | 257/2 |
| 2007/0205456 | A1 * | 9/2007 | Lee et al. ........................ | 257/314 |
| 2011/0002154 | A1 * | 1/2011 | Mitani et al. .................. | 365/148 |
| 2012/0313063 | A1 * | 12/2012 | Wang et al. ....................... | 257/2 |

FOREIGN PATENT DOCUMENTS

| | | |
|---|---|---|
| CN | 1691334 | 11/2005 |
| CN | 101030622 | 9/2007 |

(Continued)

*Primary Examiner* — Hoang-Quan Ho
(74) *Attorney, Agent, or Firm* — Snell & Wilmer LLP

(57) ABSTRACT

A resistive memory having a leakage inhibiting characteristic and a method for fabricating the same, which can suppress a sneak current in a large scaled crossing array of a RRAM. A memory cell forming the resistive memory comprises a lower electrode, a first semiconductor-type oxide layer, a resistive material layer, a second semiconductor-type oxide layer and an upper electrode which are sequentially stacked. Each of the semiconductor-type oxide layers may be a semiconductor-type metal oxide or a semiconductor-type non-metal oxide. The sneak current may be effectively reduced by means of a Schottky barrier formed between the semiconductor-type oxide layer and the metal electrode, the fabrication process is easy to be implemented, and a high device integration degree can be achieved.

3 Claims, 1 Drawing Sheet

(56) References Cited

FOREIGN PATENT DOCUMENTS

| CN | 101030623 | 9/2007 |
| CN | 101097935 | 1/2008 |
| CN | 101711431 | 5/2010 |
| CN | 101978496 | 2/2011 |
| CN | 102365750 | 2/2012 |
| CN | 102593351 | 7/2012 |
| CN | 102903845 | 1/2013 |

* cited by examiner

RESISTIVE MEMORY AND METHOD FOR FABRICATING THE SAME

CROSS REFERENCE OF RELATED APPLICATIONS

The present application claims priority of Chinese application No. 201210333457.5, filed on Sep. 10, 2012, which is incorporated herein by reference in its entirety.

FIELD OF THE INVENTION

The present invention relates to a nonvolatile memory in an ultra large scaled integrated (ULSI) CMOS circuit, and in particular to a resistive memory having a leakage inhibiting characteristic and a method for fabricating the same.

BACKGROUND OF THE INVENTION

Solid state memories play a very important role in today's information society, and they are widely used in our daily used electronic products. Conventional memories are mainly DRAMs and flash memories. With the increasing development of the semiconductor industry, a device size becomes smaller and thus the memories are approaching their physical limits. Particularly, after entering into a 22 nm technical node, the memories cannot meet the requirement of development. RRAMs become a powerful competitor among the next generation memories due to advantages such as simple structure, high density integration, low preparation temperature, compatibility with CMOS back end processes, high operation speed, low power consumption and so on. For the high density storage of RRAMs, people tend to use a crossing array structure to integrate, so that a very high density three-dimensional storage of the resistive memory can be achieved.

FIG. 1 illustrates a conventional crossing array structure, in which M bottom electrodes 13 (bit lines) parallel to each other and N top electrodes 11 (word lines) parallel to each other are perpendicularly crossed. At each crossing point, a RRAM memory cell 12 is disposed. FIG. 2 is a schematic diagram of a conventional RRAM memory cell. The RRAM memory cell includes a metal upper electrode 21, a resistive material layer 22 and a metal lower electrode 23. The RRAM memory cell has a following operation principle: in an initial state, the resistive material layer appears a high resistance state; when a voltage between the two electrodes is reached to a certain voltage, a current between the two electrodes increases sharply and the resistive material layer becomes a low resistance state, the voltage at this moment being referred to Vset; when the applied voltage becomes a predetermined value, the current between the two electrodes drops rapidly, the voltage at this moment being referred to Vreset. As such, the RRAM memory cell has two information storage states, i.e., a high resistance state ("0") and a low resistance state ("1"). Reading a resistance of the memory cell is mainly by reading an amount of a current flowing through the memory cell when applying the same voltage, so as to determine whether the memory cell is in a high resistance state or in a low resistance state. If a memory cell in the crossing array is in a high resistance state while others adjacent thereto are in a low resistance state, a correct reading for the resistance of the memory cell with high resistance may be affected. The reason lies in that, when the memory cell with high resistance is read, an applied voltage may bypass that memory cell and form a sneak current on the memory cells with low resistance, and the sneak current flowing through the memory cells with low resistance is far greater than the current flowing through the memory cell with high resistance. At this time, the current read from the memory cell with high resistance is actually the sneak current flowing through the memory cells with low resistance adjacent thereto. As a result, the memory cell with high resistance may be determined as a memory cell with low resistance, which may result in a misread and error operation. The sneak current in the array limits the further improvement of the integration density of the array. In addition, the sneak current not only causes the misread of the resistance state in the array, but also increases the overall power consumption of the array.

Currently, a 1D1R structure (one diode and one RRAM) is proposed to inhibit the generation of the sneak current in order to solve the above problems. Diodes are mainly classified into silicon-based diodes and metal-oxide-based diodes. However, the silicon-based diodes require a high fabrication temperature, and the metal-oxide-based diodes are prone to transit into the RRAM and thus lose their rectification characteristic. In addition, the diodes have a low drive current which cannot meet the usage requirement of the RRAM. Therefore, there is a need to propose a new structure for suppressing the sneak current.

SUMMARY OF THE INVENTION

An object of the present invention is directed to the above-mentioned problems and to provide a resistive memory having a leakage inhibiting characteristic and a method for fabricating the same, which can suppress the sneak current in the large-scaled crossing array of the RRAM.

In order to obtain the above objects, the present invention provides the following technical solutions.

A resistive memory cell includes a lower electrode, a first semiconductor-type oxide layer, a resistive material layer, a second semiconductor-type oxide layer and an upper electrode which are sequentially stacked.

Each of the semiconductor-type oxide layers may be a semiconductor-type metal oxide, such as titanium oxide (TiOx), nickel oxide (NiOx), or may be a semiconductor-type non-metal oxide.

The resistive material layer may be a transition metal oxide, a perovskite oxide, a rare metal oxide or a ferromagnetic material etc., each of which has a resistive characteristic.

Each of the electrodes may be a metal electrode or a poly-silicon electrode. For example, the upper electrode may select titanium nitride (TiN), and the lower electrode may select platinum (Pt).

A resistive memory comprises a plurality of the above-mentioned resistive memory cells.

A method for fabricating a resistive memory cell comprises following steps:

1) Preparing a substrate;
2) Depositing a metal lower electrode on a surface of the substrate;
3) Depositing a first semiconductor-type oxide layer on the lower electrode;
4) Depositing a resistive material layer on the first semiconductor-type oxide layer and performing an annealing process;
5) Depositing a second semiconductor-type oxide layer on the resistive material layer; and
6) Depositing a metal upper electrode on the second semiconductor-type oxide layer.

Preferably, in each of the steps 2) and 6), the depositing is performed by using a magnetron sputtering method; in each of the steps 3) to 5), the depositing is performed by using a reaction sputtering method.

A structure of the RRAM proposed in the present invention is consistent with a plate capacitor structure, in which each of the semiconductor-type oxide layers is added between the resistive material layer and the upper electrode and between the resistive material layer and the lower electrode, respectively. Thereby, the sneak current may be effectively reduced by means of a Schottky barrier formed between the semiconductor-type oxide layer and the metal electrode. The structure of the RRAM and the fabrication process thereof according to the present invention are easy to be implemented. A top electrode and a bottom electrode may be formed as a crossbar structure, in which a RRAM memory cell is disposed at an intersection of the top electrode and the bottom electrode, and thus a high device integration degree can be achieved.

DETAILED DESCRIPTION OF THE EMBODIMENTS

Hereinafter, the present invention will be further explained by specific embodiments in conjunction with drawings.

Figure 1:
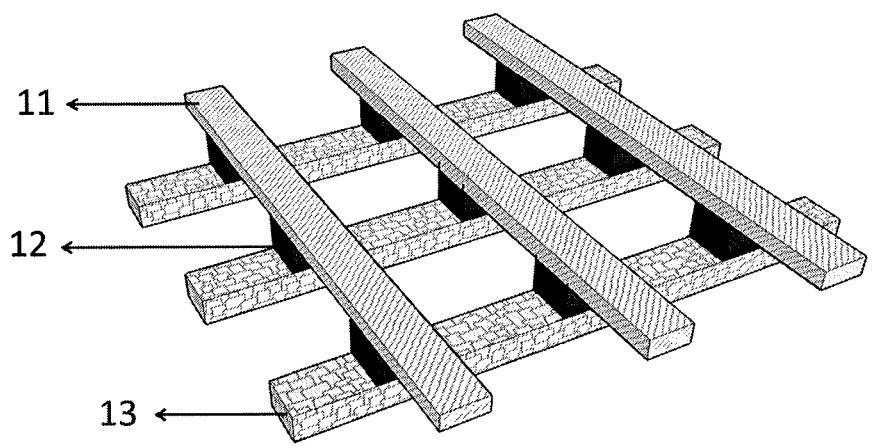
FIG. 1 is a schematic diagram showing a crossing array of the RRAM in the prior art, in which 11 denotes a word line, 12 denotes a RRAM cell, and 13 denotes a bit line.
Figure 2:
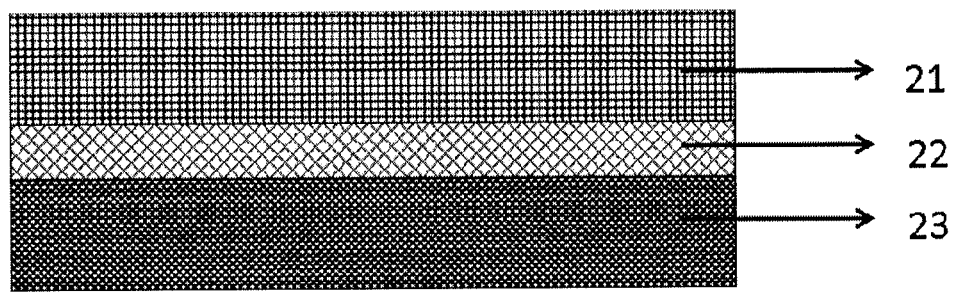
FIG. 2 is a schematic diagram showing a RRAM memory cell in the prior art, in which 21 denotes a metal upper electrode, 22 denotes a resistive material layer, and 23 denotes a metal lower electrode.
Figure 3:
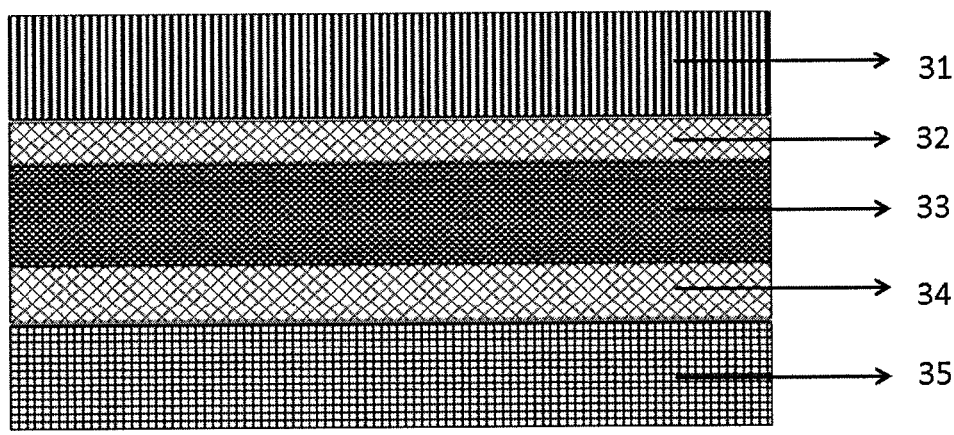
FIG. 3 is a schematic diagram showing a RRAM memory cell according to an embodiment of the present invention, in which 31 denotes a metal upper electrode, 32 denotes a first semiconductor-type metal oxide layer, 33 denotes a resistive material layer, 34 denotes a second semiconductor-type metal oxide layer, and 35 denotes a metal lower electrode.

FIG. 3 is a schematic diagram showing a RRAM memory cell according to an embodiment of the present invention. The RRAM memory cell includes a metal upper electrode 31, a semiconductor-type metal oxide layer 32, a resistive material layer 33, a semiconductor-type metal oxide layer 34, and a metal lower electrode 35. Since the semiconductor-type metal oxide layers are semiconductor type, Schottky barriers may be formed between the metal upper electrode 31 and the semiconductor-type metal oxide layer 32, and formed between the semiconductor-type metal oxide layer 34 and the metal lower electrode 35. When the RRAM is in a low resistance state, a current flowing through the RRAM under a relatively small voltage becomes smaller due to the existence of the Schottky barriers, thereby effectively reducing the generation of the sneak current.

A fabrication process for the above-mentioned RRAM memory cell is illustrated below in detail. The RRAM memory cell uses TaOx as the resistive material layer, and has a structure of TiN/TiOx/TaOx/TiOx/Pt.

1. A step of preparing a substrate: a silicon (100) is used as the substrate, on which a $SiO_2$ layer with a thickness of about 1000 Å is grown through an oxidation process.

2. A step of preparing a lower electrode: a photoresist with a certain thickness is spin-coated on a serrated surface of the substrate, and a lower electrode pattern is defined by an exposure process. After a developing process, a metal lower electrode layer (35) of Pt, which has a thickness in a range of 100-200 nm, is deposited by using a magnetron sputtering process. Then, the metal electrode of Pt is formed by being subjected to a stripping process.

3. A step of depositing a first semiconductor-type metal oxide layer: after the lower electrode is formed, a TiOx layer (34) with a thickness in a range of 5 nm-10 nm is deposited over the $SiO_2$ layer by using a reaction sputtering process.

4. A step of depositing a resistive material layer: after the TiOx layer (34) is formed, a resistive material layer (33) of TaOx, which has a thickness in a range of 10-60 nm, is deposited on the TiOx layer (34) by using a reaction sputtering process. Then, an annealing process is performed in an oxygen atmosphere at a temperature of 400° C. for 1 hour.

5. A step of depositing a second semiconductor-type metal oxide layer: after the TaOx layer (33) is formed, a TiOx layer (32) with a thickness in a range of 5 nm-10 nm is deposited on the TaOx layer (33) by using a reaction sputtering process.

6. A step of depositing an upper electrode: a photoresist is spin-coated onto the TiOx layer (32), and an intermediate electrode pattern is defined by an exposure process. After a developing process, a metal upper electrode layer (31) of TiN with a thickness in a range of 100 nm-200 nm is deposited by using a magnetron sputtering equipment. The photoresist is removed by acetone. Then, the metal electrode of TiN is formed by being subjected to a stripping process.

The above embodiments are described by examples only for the purpose of illustration. The scope of the present invention should be based on the appended claims and is not only limited to the above embodiments.

What is claimed is:

1. A method for fabricating a resistive memory cell, comprising the following steps:
    1) Preparing a substrate;
    2) Depositing a metal lower electrode on a surface of the substrate;
    3) Depositing a first semiconductor-type oxide layer on the lower electrode;
    4) Depositing a resistive material layer on the first semiconductor-type oxide layer and performing an annealing process;
    5) Depositing a second semiconductor-type oxide layer on the resistive material layer; and
    6) Depositing a metal upper electrode on the second semiconductor-type oxide layer, wherein in each of the steps 2) and 6), the depositing is performed by using a magnetron sputtering method; and in each of the steps 3) to 5), the depositing is performed by using a reaction sputtering method.

2. The method of claim 1, wherein the lower electrode is Pt, with a thickness of 100-200 nm; the upper electrode is TiN, with a thickness of 100-200 nm; the resistive material is TaOx, with a thickness of 10-60 nm; each of the semiconductor-type oxide layers is TiOx, with a thickness of 5-10 nm.

3. The method of claim 1, wherein in the step 4), the annealing process is performed in an oxygen atmosphere at a temperature of 400° C. for 1 hour.

* * * * *